(12) United States Patent
Shaw

(10) Patent No.: US 6,218,225 B1
(45) Date of Patent: Apr. 17, 2001

(54) APPARATUS AND METHOD FOR HIGH DENSITY CMOS GATE ARRAYS

(75) Inventor: Ching-Hao Shaw, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/306,184

(22) Filed: May 6, 1999

Related U.S. Application Data
(60) Provisional application No. 60/085,508, filed on May 14, 1998.

(51) Int. Cl.⁷ .................................................. H01L 21/8238
(52) U.S. Cl. ............................ 438/199; 438/599; 438/622
(58) Field of Search .................................... 438/199, 598, 438/599, 622; 257/371

(56) References Cited

U.S. PATENT DOCUMENTS 5,428,255 * 6/1995 Wall ........................................ 326/41
5,591,995 * 1/1997 Shaw .................................... 257/206

* cited by examiner

*Primary Examiner*—Sara Crane
(74) *Attorney, Agent, or Firm*—Alan K. Stewart; Wade James Brady, III; Frederick J. Telecky, Jr.

(57) ABSTRACT

A base cell, having four sites, for use in a gate array retains the same design rules as a prior art base cell, but the area of the base cell has been reduced. The reduction in the size of the base cell is the result of arranging all transistor pairs to be fabricated over a common moat regions, thereby eliminating areas previously used for moat-to-moat spacing. In addition, at least one moat region is configured to permit a conducting path passing nearby to observe the design rules without appreciable. Components forming the base cell have been rearranged to permit the D-type flip-flop circuit to be implemented using three of the base cell sites instead of the four base cell sites required by the prior art. This component rearrangement is useful for other circuits implemented by the base cell as well.

7 Claims, 6 Drawing Sheets

APPARATUS AND METHOD FOR HIGH DENSITY CMOS GATE ARRAYS

This application claims priority under 35 USC §119(e)(1) of provisional application No. 60/085,508 filed May 14, 1998.

BACKGROUND OF THE INVENTION

1. Field of the Invention

This invention relates generally to semiconductor integrated circuit devices, and more particularly, to the integrated circuit devices having a multiplicity of components generally referred to as gate arrays.

2. Description of the Prior Art

Gate array devices are fabricated to include a multiplicity of component sets. Each component set, typically referred to as a base cell, has a plurality of components which can be configured to implement a wide variety of circuit sets in response to the requirements of the specific application. As a practical matter, the circuit most widely implemented by gate arrays are D-type multivibrator (flip-flop) circuits. In general, 60% of the circuits implemented by gate arrays can be flip-flop circuits.

U.S. Pat. No. 5,591,995, issued on Jan. 7, 1997 in the name of the inventor of the present Application and assigned to the same assignee as the present Application, discloses a base cell configuration that can be used, inter alia, to implement the D-type flip-flop circuit. A slightly modified version of the prior art base cell configuration of U.S. Pat. No. '995 is shown in a plan view in FIG. 1A. In FIG. 2A, a schematic circuit diagram of the components implemented by this prior art base cell is shown. In FIG. 3A, a circuit diagram of a D-type flip-flop circuit to be implemented by the base cell is shown. In FIG.4A, a plan view of the metal layer required to provide a D-type flip-flop circuit in the base cell shown in FIG. 1A is illustrated.

Referring once again to FIG. 1A and FIG. 2A, the plan view representation of the prior art base cell and the circuit component schematic representation of the prior art base cell, respectively, are shown. The base cell includes CL and CS sites. Generally, the CL sites have transistors with larger CMOS gate widths, while the CS sites generally have transistors with smaller CMOS gate widths. Each CL site includes a pair of n-channel pass transistors 6, a pair of n-channel transistors 8, a pair of p-channel transistors 10 and a pair of small p-channel transistors 12. The pass transistors 6 are typically used as pass gates in conjunction with a static random access memory (SRAM). However, the pass transistors can be used of other logic gates in configuring the gate array. Transistors 8 and 10 are typically used in combination to form a CMOS logic gate or drive circuitry. With respect each CS site, this site includes a pair of pass transistors 6, two pairs of n-channel transistors 14 and two pairs of p-channel transistors 16. Transistors 14 and 16 are matched as closely as possible to one half the size of transistors 8 and 10.

Referring to FIG. 3A, a schematic circuit diagram of a D-type flip-flop circuit that can formed from the base cell illustrated in FIGS. 1A and 2A is shown. The input data signal node D is coupled to an input terminal of inverting amplifier 31, while the input clock signal node CLK is coupled to the input terminal inverting amplifier 32. The output terminal of inverting amplifier 31 is coupled to the DN node, the DN node also being coupled to a data input terminal of pass-gate 33. The output terminal of inverting amplifier 32 is coupled to node CLKZ, the node CLKZ also being coupled to an input terminal of inverting amplifier 34, to a control terminal of pass-gate 33, to a control terminal of pass-gate 35, and to a control terminal of pass-gate 38, and to a control terminal of pass-gate 39. The output terminal of pass-gate 33 is coupled to node N1, node N1 also being coupled to an input terminal of inverting amplifier 36 and to an output terminal of pass-gate 35. The output terminal of inverting amplifier 34 is coupled to node CLKT, the node CLKT also being coupled 33 to a control terminal of pass-gate 33, to a control terminal of pass-gate 35, to a control terminal of pass-gate 38 and to a control terminal of pass-gate 39. An output terminal of inverting amplifier 36 is coupled to node N5, node N5 also being coupled to an input terminal of inverting amplifier 37 and to an input terminal of pass-gate 38. An output terminal of inverting amplifier 37 is coupled to node N3, node N3 also being coupled to an input terminal of inverting amplifier 35. The output terminal of pass-gate 38 is coupled to node N2, node N2 also being coupled to input terminal of inverting amplifier 40 and to an output terminal of pass-gate 39. The output terminal of inverting amplifier 40 is coupled to node N6, node N6 also being coupled to an input terminal of inverting amplifier 42 and to an input terminal of inverting amplifier 41. An output terminal of inverting amplifier 41 is coupled to node N4, node N4 also being coupled to an input terminal of pass-gate 39. The output terminal of inverting amplifier 42 is the output signal node Q.

Referring to FIG. 4A, the metal layer required to implement a D-type flip-flop circuit for the prior art base cell of FIG. 1A and FIG. 2A is shown. Each of the nodes, N1–N6, shown in FIG. 3A are identified. Note that the implementation of D-type flip-flop circuit requires components from each of the four sites comprising a base cell. Several of the nodes are implemented by a plurality of conducting paths. These nodes are coupled through conducting paths, formed below the metal layer, the conducting paths and the metal layer traces being coupled by conducting plugs. Using the design rules, e.g., for the distance between specified areas, the width of preselected paths, etc., the pitch of the cell, i.e., the spacing between uniformly spaced grid markers is 2.4 um in both the x-direction and in the y-direction. The each site of the base cell is four grid lengths in the x-direction and 17 grid lengths in the y-direction.

Because of the frequency of the implementation of D-type flip-flop circuits, a need has been felt to provide a base cell in which the D-type flip-flop circuit can be implemented without requiring components from all of the sites of the base cell. A need has further been felt to provide a technique for reducing the pitch of a base cell while still maintaining the same design rules resulting in the prior art base cell. Finally, it would be desirable to arrange the components of the base cell to provide a simplified interconnect metal layer coupling the components.

SUMMARY OF THE INVENTION

The aforementioned and other features are accomplished, according to the present invention, by providing a gate array having large and small sites, each site having a plurality of transistors arranged in pairs. Each pair of transistors is fabricated having a common source drain region, i.e., having a common moat region. At least one of the moat regions has been relocated to form more easily a complementary gate.. In addition, at least one large moat region is fabricated with an extended missing section to permit a conducting plug to pass thereby, while maintaining a base cell having a reduced pitch. In this manner, not only can size of the base cell be reduced, but the coupling of base cell components into a D-type flip-flop circuit can be accomplished using three base cell sites rather than the four base cell sites of the prior art.

These and other features of the present invention will be understood upon the reading of the following description in conjunction with the Figures.

BRIEF DESCRIPTION OF THE DRAWING

FIG. 1A is a plan view of a base cell according to the prior art, while

FIG. 2A is a schematic diagram of the circuit components of the base cell according to the prior art, while

FIG. 3A is a schematic diagram of D-type flip-flop circuit that can be formed from the base cell of FIG. 1A and FIG. 2A, while

FIG. 4A is plan view of the metalization layer associated with the base cell of FIG. 1A and FIG. 2A that implements the D-type flip-flop circuit of FIG. 3A, while

DESCRIPTION OF THE PREFERRED EMBODIMENT(S)

1. Detailed Description of the Drawings

FIG. 1A, FIG. 2A, FIG. 3A and FIG. 4A have been discussed in relationship to the prior art.

Figure 1A:
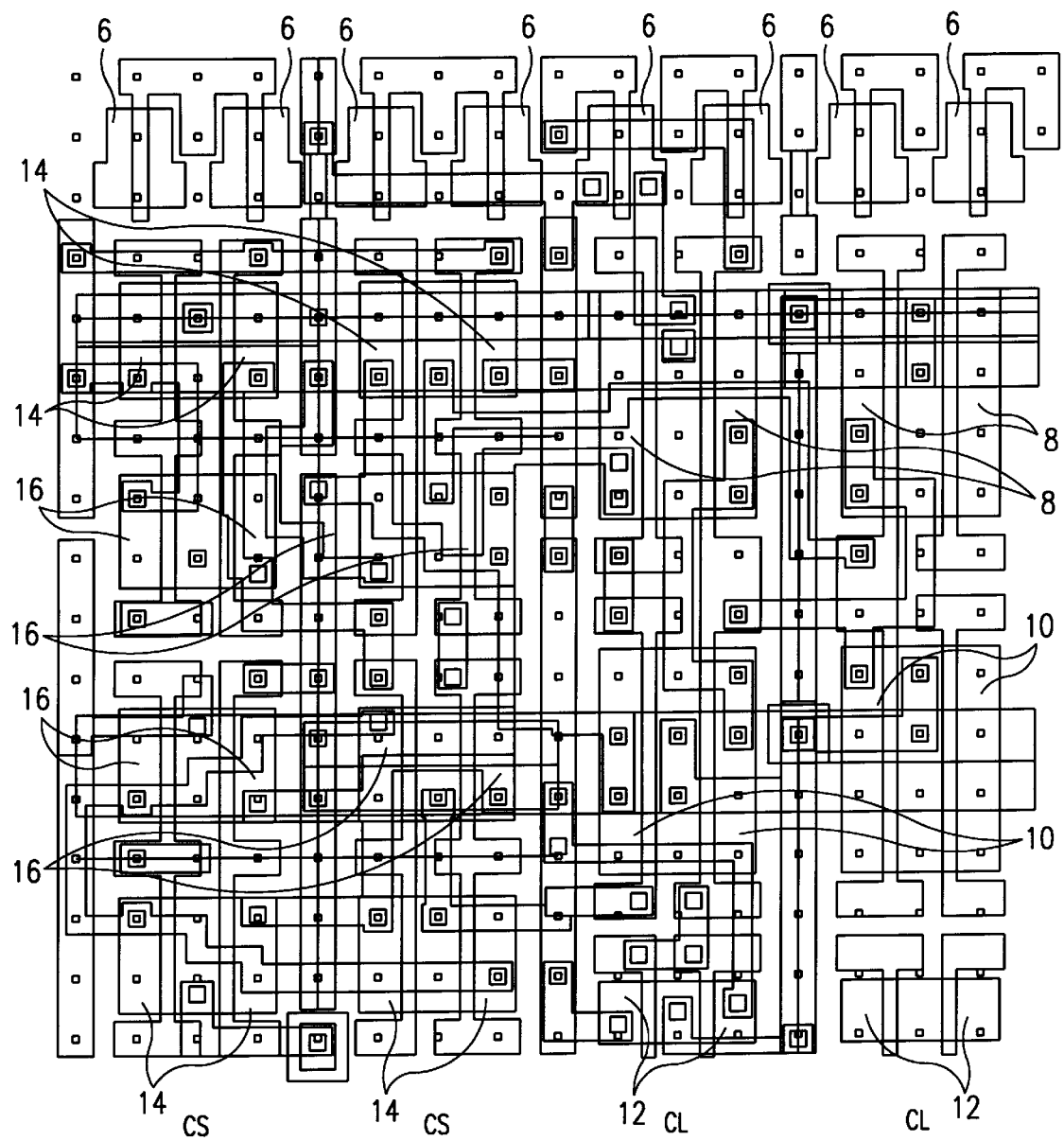
Figure 1B:
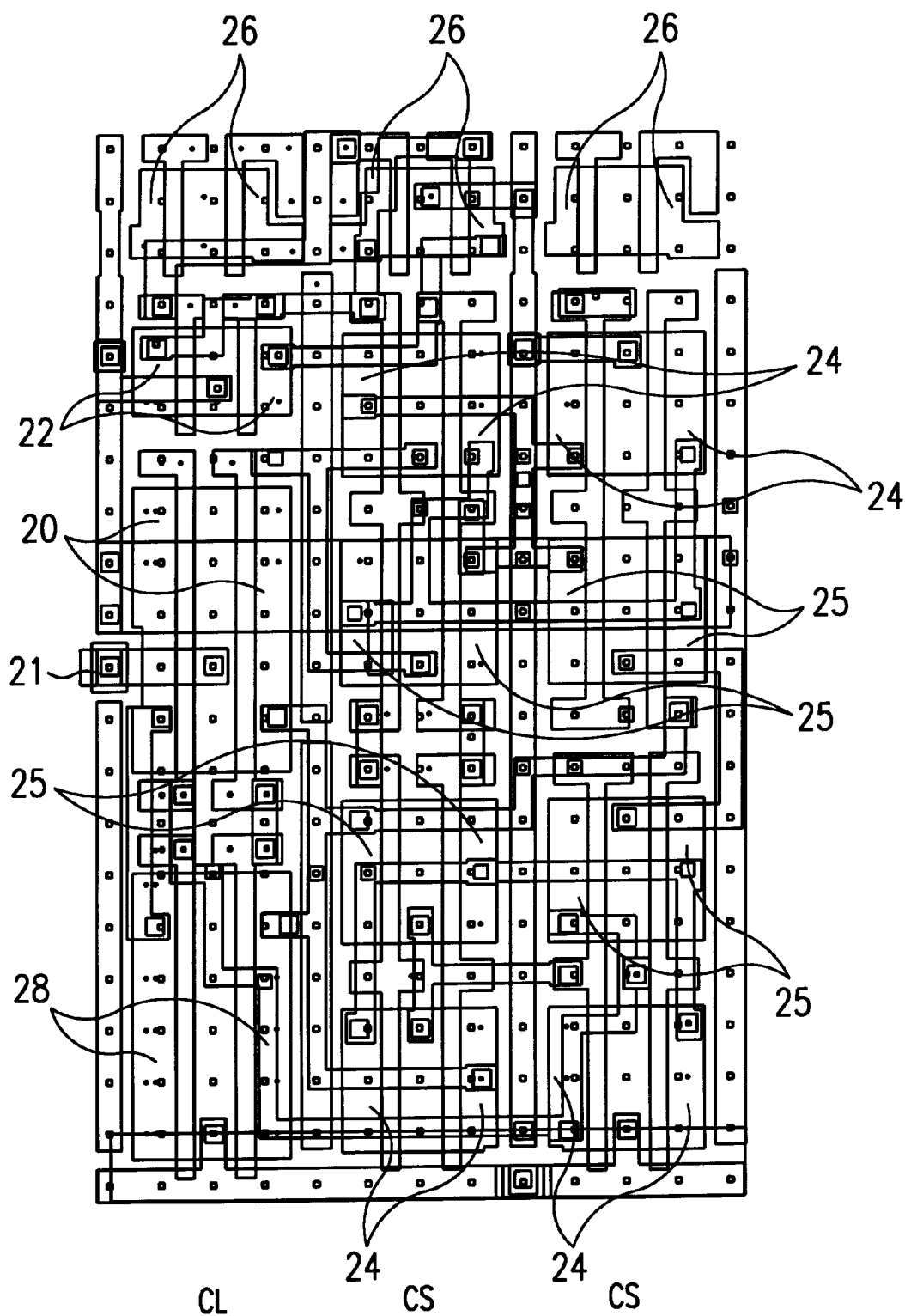
FIG. 1B is a plan view of the base cell.
Figure 2A:
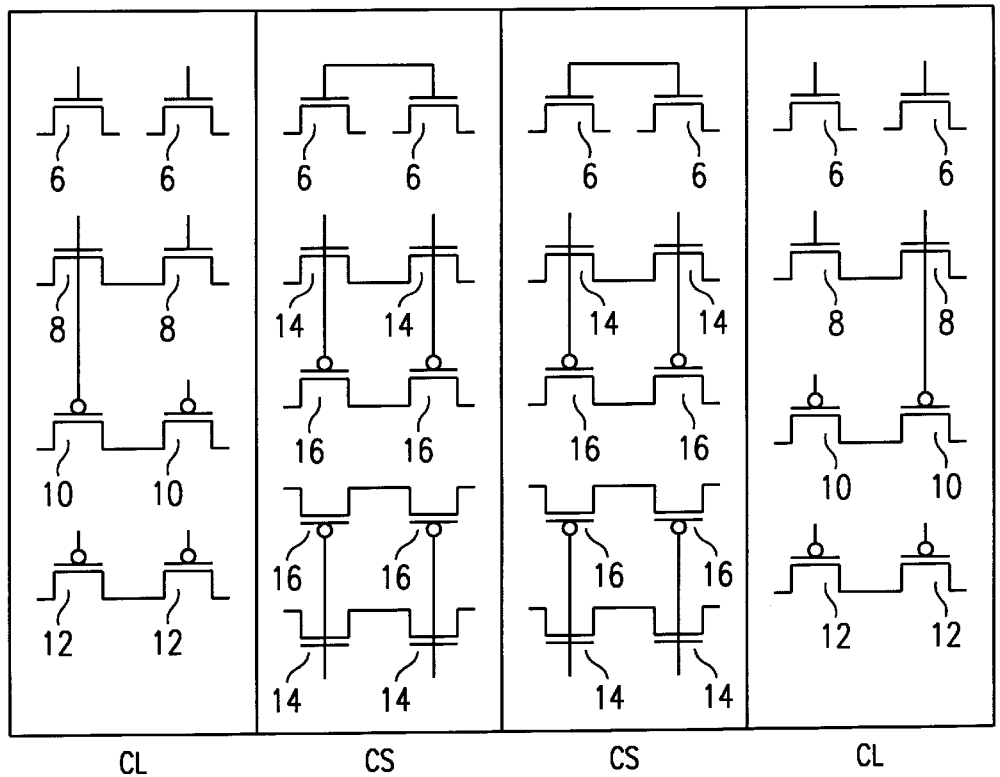
Figure 2B:
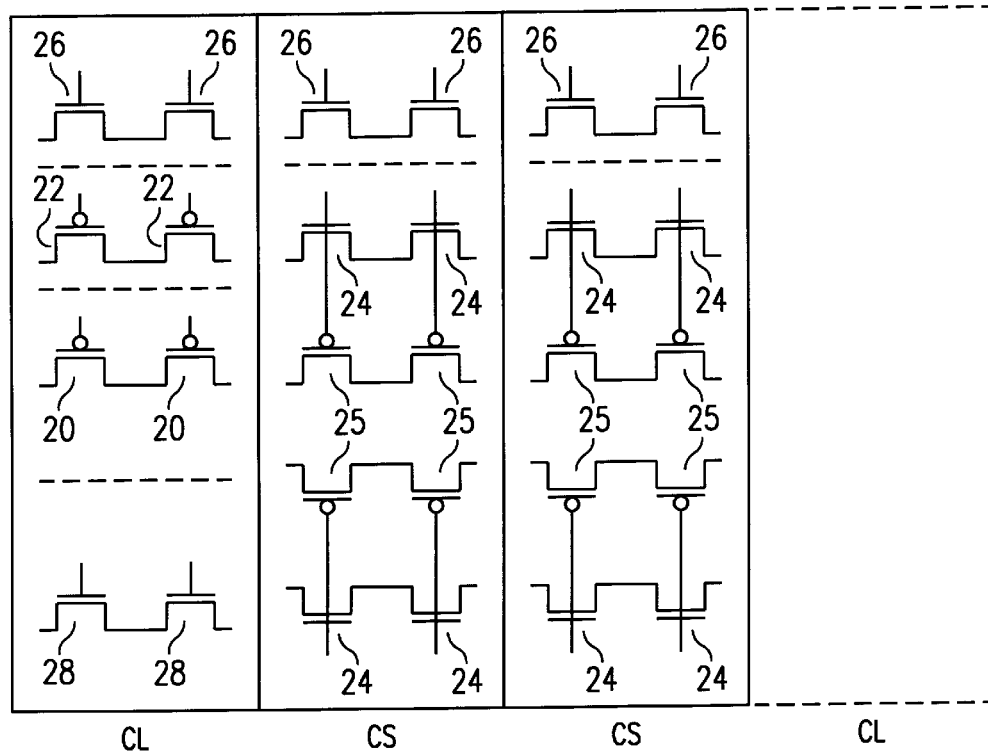
FIG. 2B is a schematic diagram of the circuit components of the base cell.

Referring to FIG. 1B and FIG. 2B, a plan view and a schematic circuit component, respectively, are shown for a gate array cell base of the present invention. As with the prior art base cell shown in FIG. 1A and FIG. 2A, the base cell includes two large CMOS (CL) sites and two small CMOS (CS) sites. (In FIG. 1A, the right-most CL site should be repositioned to the left side of base cell to be consistent with FIG. 2A.) The CL site of the base cell includes a pair of n-channel transistors 28, a pair of n-channel transistors 26, a pair of p-channel transistors 22 and a pair of p-channel transistors 20. Each CS site includes a pair of n-channel pass transistors 26, two pairs of n-channel transistors 24, and two pairs of p-channel transistors 25. In the present implementation, the pass transistors 26 of both the CL site and the CS site have a common source-drain terminal, i.e., share a common moat. In addition, in the CL site a position of a p-channel transistor pair 22 (i.e., 22 in FIG. 2B) has been exchanged with an n-channel transistor pair (i.e., 8 in FIG. 2 2A). Referring to FIG. 1B, the conducting plug 21 extends to the n-well. In order to stay within the design rules and maintain the smaller pitch, a large moat (i.e., p-channel diffusion) region (in which transistors 20 are implemented) has a small region removed therefrom. This removed region or notch in a large moat region permits the conducting plug to pass by the moat region at sufficient distance to maintain the design rules. By removing a relatively small region from a large moat region, the operation of the transistor implemented by the moat region is not appreciably affected. In addition, it will be seen that a p-channel region in a CL site implementing transistors 22 has been moved to a position next to the pass transistors 26 of the CL site.

Figure 3A:
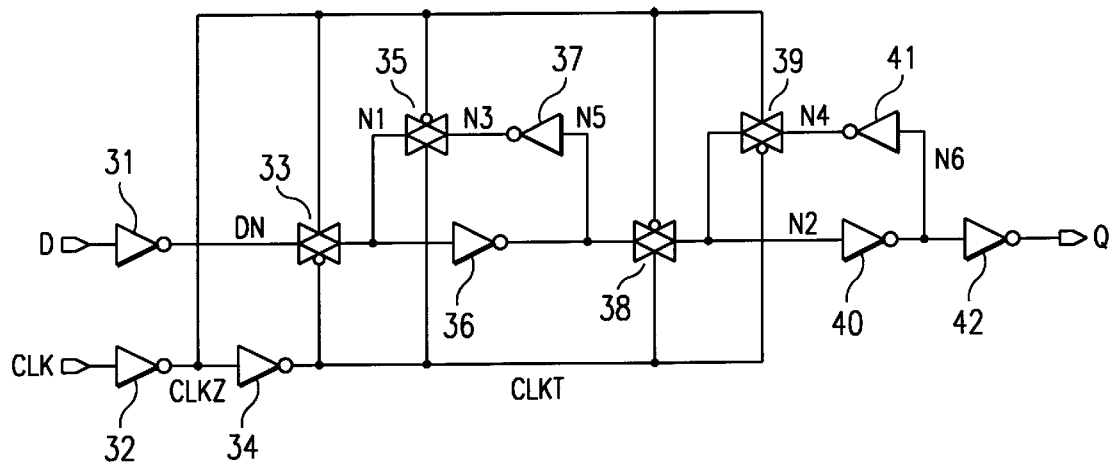
Figure 3B:
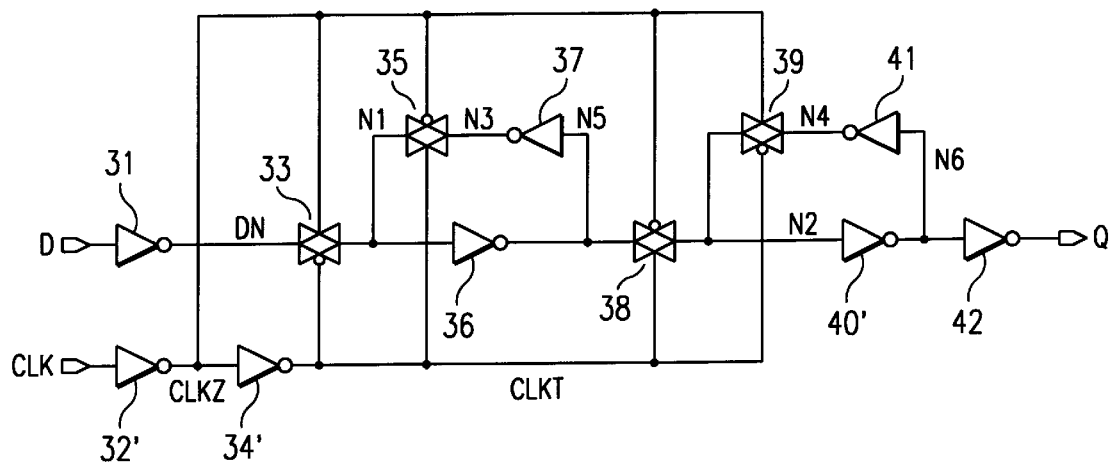
FIG. 3B is a schematic diagram of a D-type flip-flop circuit that can be formed from the base cell of FIG. 1B and FIG. 2B.

Referring next to FIG. 3B, a schematic diagram of the D-type flip-flop circuit implemented by the base cell of the present invention is shown. The schematic circuit diagrams are the same. However, transistors implementing inverting amplifiers 32 and 34 of FIG. 3A are one half the standard transistor width, while in FIG. 3B, the transistors implementing inverting amplifiers 32' and 34' are one third the standard transistor width. Similarly, transistor 40 is a standard width while the transistor implementing inverting amplifier 40' is one half the standard transistor width.

Figure 4A:
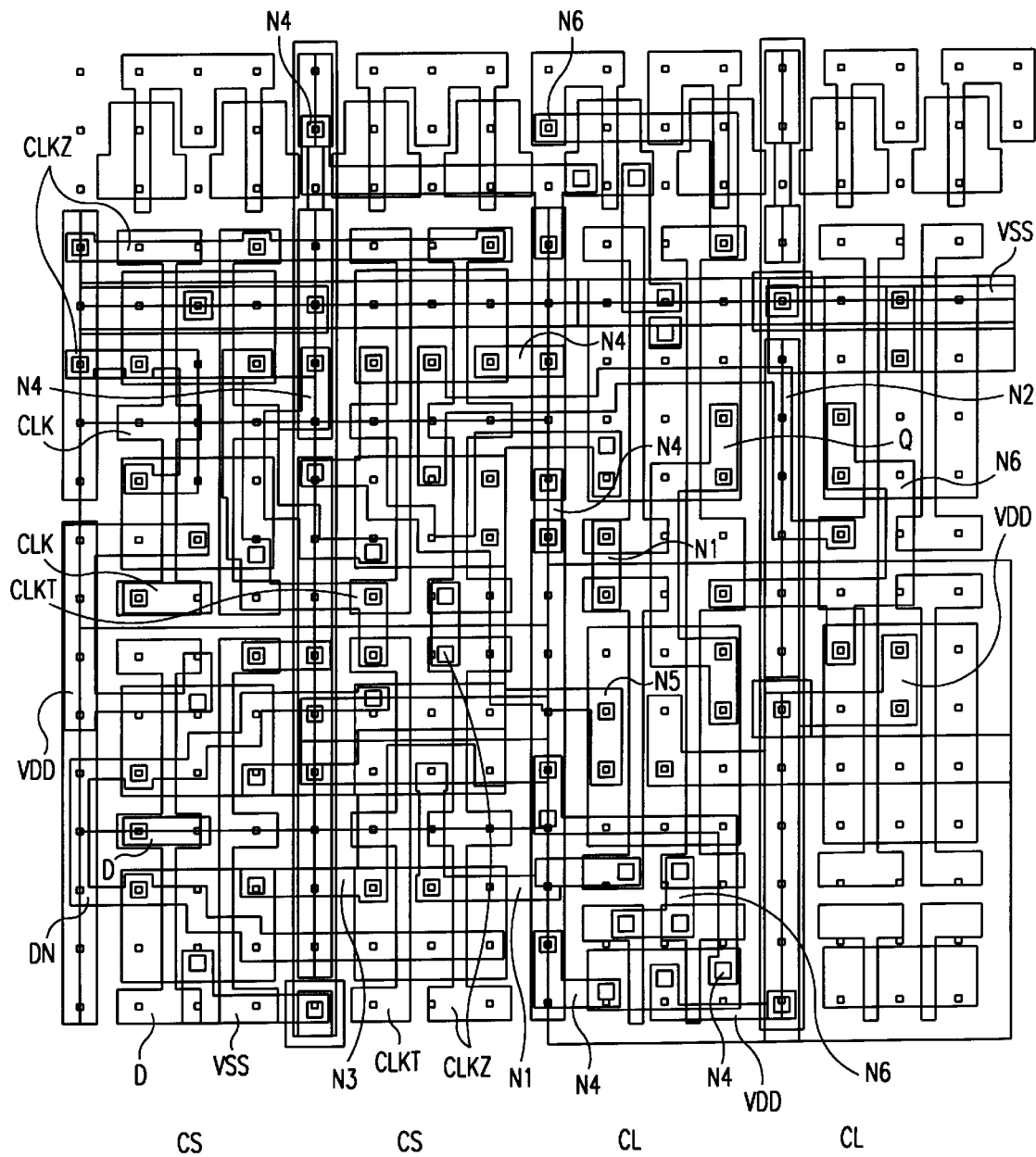
Figure 4B:
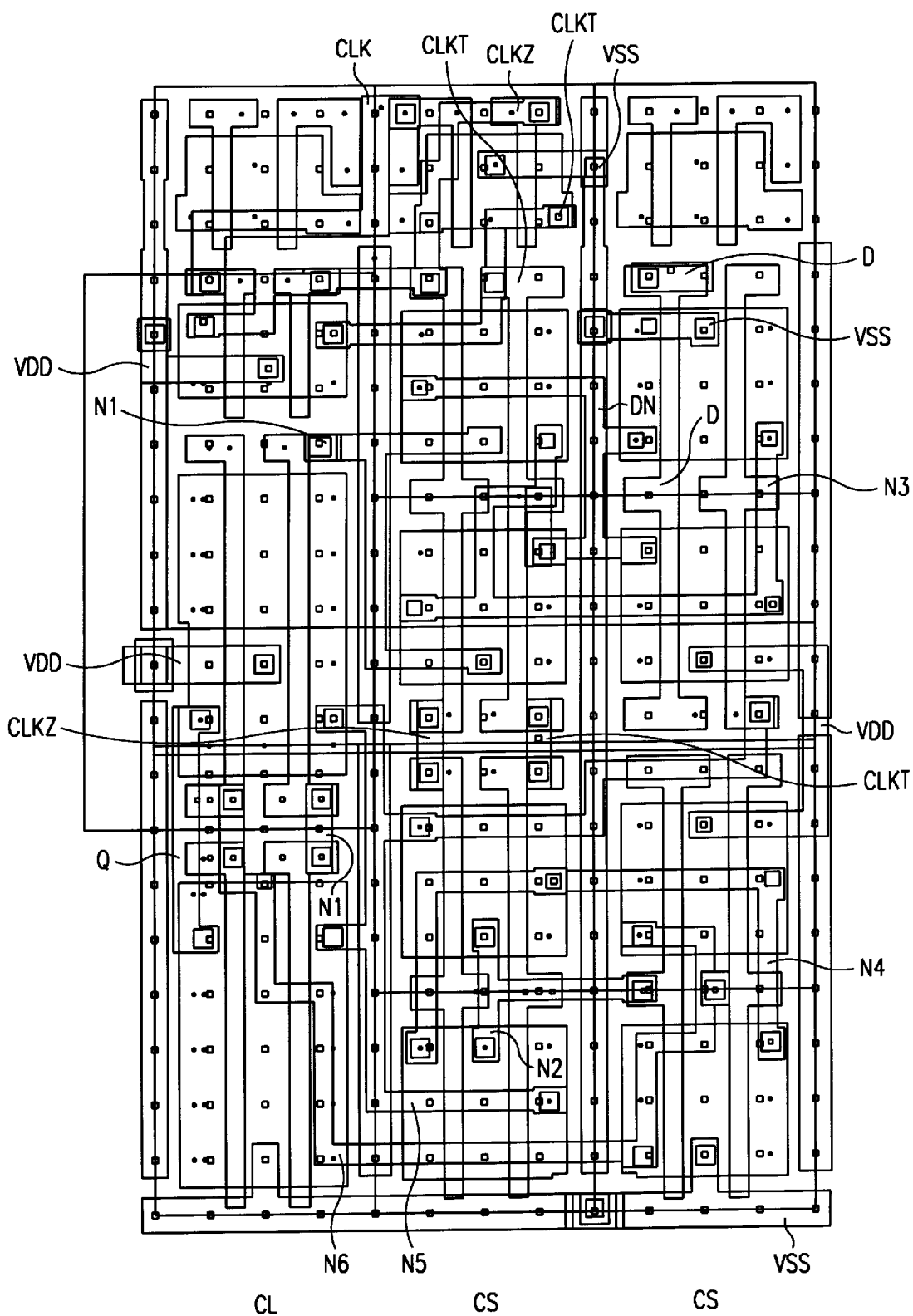
FIG. 4B is a plan view of the metalization layer associated with the base cell of FIG. 1B and FIG. 2B that implements the D-type flip-flop circuit of FIG. 3B.

Referring to FIG. 4B, and comparing to this Figure to FIG. 4A, it will be clear that metal layer paths super imposed on the base cell implement a D-type flip-flop circuit with three bsae cell sites rather than the four base cell sites of the prior art (i.e., FIG. 4A). In general, the geometry of the metal layer present invention is simpler than the metal layer geometry of the prior art. The pitch of the inventive base cell is now 1.7 um in the x-direction and 1.7 um in the y-direction. Each site is 4 grid lengths in the x-direction and 20.5 grid lengths in the y-direction.

2. Operation of the Preferred Embodiment(s)

Using the same design rules, the base cell of the present invention can be implemented with a base cell having pitch of 1.7 um in the x-direction as compared to the base cell having a pitch of 2.4 um in the x-direction found in the prior art. This reduction in base cell pitch is accomplished by several techniques. First, comparing FIG. 2A and FIG. 2B, the transistor 6, arranged in pairs in FIG. 2A, are fabricated with the source-drain terminals uncoupled, i.e., the transistors are fabricated in separate moat regions. The combining of moat regions, as shown in FIG. 2B, eliminates the need for spacing (isolation) between moat regions found in the prior art FIG. 2A. In order to apply voltage to the n-well, a nearby large moat region has a section removed therefrom. As a result of this section removal, the distance between the conducting path and the (p-channel) diffusion region is maintained within the design rules. Because the section is removed from a large diffusion site, the effect of this section removal on the operation of the transistor implemented with this diffusion region is minimal.

The movement of the p-channel transistor to the vicinity of the pass transistors simplifies the conducting pat routing and decreases the signal delay. When this component is used in the distribution of clocking signals, less impedance loading is found. In addition to the p-type flip-flop circuits, the repositioning of transistor component is advantageous, for example, in Exclusive OR logic gates and in tri-state circuits. Expressed in another manner, the positioning of the n-channel and the p-channel transistor pairs in close proximity facilitates the connection of complementary gates in the base cell.

As a result of the shrinking of the base cell, rearranging the components, and the use of fewer sites to implement the electronic circuit, the gate packing density is increased. This increase for the D-type flip-flop circuit is calculated to be a factor of 1.89 (i.e., the ratio of the areas of the two base cells times ratio of the increased usage of the gate per sites= $\{391.68/238.98\} \times \{1.6/1.4\} = 1.89$).

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. The method of forming a CMOS gate array base cell, said method comprising the steps of:

dividing said base cell into a plurality of sites, said plurality of sites being positioned in a row, said plurality of sites including a large gate width sites and small gate width sites;

in each of said sites, forming a plurality of transistor pairs, each transistor pair being formed over a common moat, wherein each site includes an n-channel pass transistor pair positioned proximate an external base boundary; and in at least one of said large gate width sites, forming a conducting plug positioned in a vertical relationship and proximate a selected moat, wherein said selected moat has a portion removed therefrom, said removed portion of said selected moat permitting said conducting plug to remain a predetermined distance from said selected moat.

2. The method of claim 1 further comprising the step of, in a large gate width site, forming a p-channel transistor pair proximate said n-channel transistor pair.

3. The method of claim 2 wherein said dividing step includes the step of dividing said base cell into two large gate width sites and two small gate width sites.

4. The method of claim 3 further comprising the steps of:

forming four transistor pairs in each large gate width site; and forming five transistor pairs in each small gate width site.

5. The method of claim 4 further comprising the step of coupling transistors from three of said base cell sites to form a D-type flip-flop circuit.

6. The method of claim 1 wherein an area of said base cell is reduced by a factor of approximately a factor of 0.61 as a result of said steps.

7. The method of claim 4 wherein a gate packing factor is increased by approximately 1.9 as a result of said method.

* * * * *